(12) United States Patent
Sunakawa et al.

(10) Patent No.: US 6,348,096 B1
(45) Date of Patent: *Feb. 19, 2002

(54) METHOD FOR MANUFACTURING GROUP III-V COMPOUND SEMICONDUCTORS

(75) Inventors: Haruo Sunakawa; Akira Usui, both of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/038,273

(22) Filed: Mar. 11, 1998

(30) Foreign Application Priority Data

Mar. 13, 1997 (JP) ............................................. 9-059076

(51) Int. Cl.[7] .......................... C30B 25/04; C30B 29/38
(52) U.S. Cl. ......................................... 117/88; 117/952
(58) Field of Search ................................ 117/913, 923, 117/84, 88, 92, 95, 97, 101, 104, 952, 954, 955

(56) References Cited

U.S. PATENT DOCUMENTS

| | | | | |
|---|---|---|---|---|
| 4,482,422 A | | 11/1984 | McGInn et al. | ............... 156/612 |
| 4,578,142 A | * | 3/1986 | Corboy, Jr. et al. | ......... 156/612 |
| 4,612,072 A | * | 9/1986 | Morrison et al. | ............ 148/175 |
| 4,908,074 A | * | 3/1990 | Hosoi et al. | ................ 148/33.2 |
| 5,090,932 A | | 2/1992 | Dieumegard et al. | ......... 445/24 |
| 5,290,393 A | * | 3/1994 | Nakamura | ................... 156/613 |
| 5,482,002 A | * | 1/1996 | Kawade et al. | ............... 117/90 |

FOREIGN PATENT DOCUMENTS

| | | | | |
|---|---|---|---|---|
| JP | 49-42350 | 11/1974 | | |
| JP | 56-059699 | 5/1981 | ............. | H01S/5/30 |
| JP | 06-105797 | 6/1991 | ............. | H01L/33/00 |
| JP | 04-084418 | 3/1992 | ............. | C30B/25/02 |
| JP | 04-127521 | 4/1992 | ............. | H01S/5/30 |
| JP | 06-163930 | 6/1994 | ............. | H01S/5/30 |
| JP | 8-64791 | * 3/1996 | ............. | H01L/27/12 |
| JP | 11-031864 | 2/1999 | ............. | H01S/5/30 |
| JP | 11-135770 | 5/1999 | ............. | H01S/5/30 |
| JP | 2000-012976 | 1/2000 | ............. | H01S/5/30 |
| WO | WO97/11518 | 3/1997 | ............. | H01S/5/30 |

OTHER PUBLICATIONS

Hiramatsu et al., "Relaxation Mechanism of Thermal Stresses in the Heterostructure of GaN Grown on Sapphire by Vapor Phase Epitaxy", Jpn. J. Appl. Phys., vol. 32, pp. 1528–1533 (1993).

Usui et al. Japanese Journal of Applied Physics Part 2, Jul. 15, 1997, vol. 36 No. 7B, p. L899–902, Thick GaN Epitaxial Growth with Low Dislocation Density by Hydride Vapor Phase Epitaxy Publication of Technical Society of the Institute of Electrical Engineers of Japan, Optical and Quantam Devices Technical Society ODQ–91–54–59.

Ujiee, Yoshinori et al., Epitaxial Lateral Overgrowth of GaAs on a Si Substrate, Japanese Journal of Applied Physics, vol. 28, No. 3, Mar. 1989, pp. L337–L339.

Electrical Association Research Institute Materials, EFM093–20, Dec. 1992, pp. 19–26.

* cited by examiner

*Primary Examiner*—Benjamin L. Utech
*Assistant Examiner*—Matthew Anderson
(74) *Attorney, Agent, or Firm*—Foley & Lardner

(57) ABSTRACT

The Group III–V compound semiconductor manufacturing method which pertains to the present invention is a semiconductor manufacturing method employing epitaxy which comprises (a) a step in which growing areas are produced using a mask patterned on a substrate surface and (b) a step in which a Group III–V compound semiconductor layer is grown in the growing areas while forming facet structures.

As epitaxy is continued, adjacent facet structures come into contact so that the surface of the semiconductor layer becomes planarized. Since lattice defects extend towards the facet structures, they do not extend towards the surface of the semiconductor layer. Accordingly, the number of lattice defects in the vicinity of the semiconductor layer surface is reduced.

27 Claims, 7 Drawing Sheets

F I G. 1
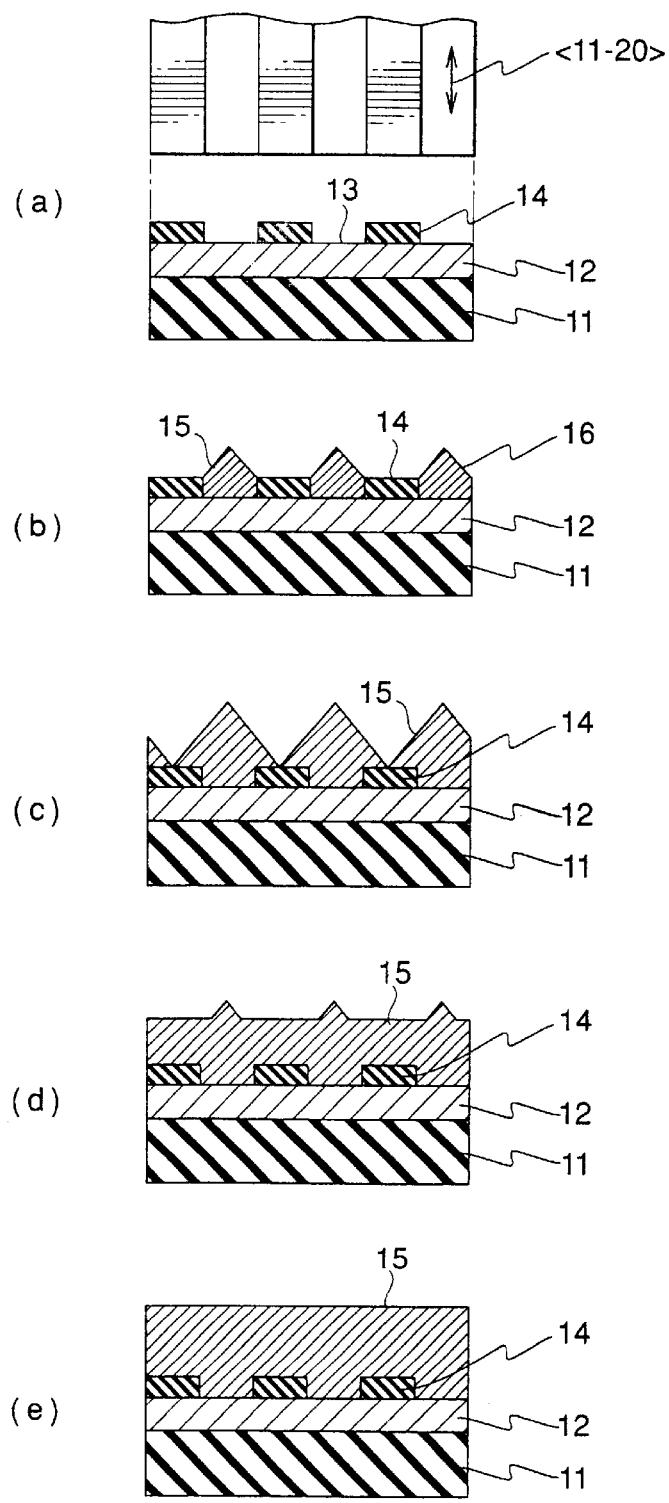

FIG.6
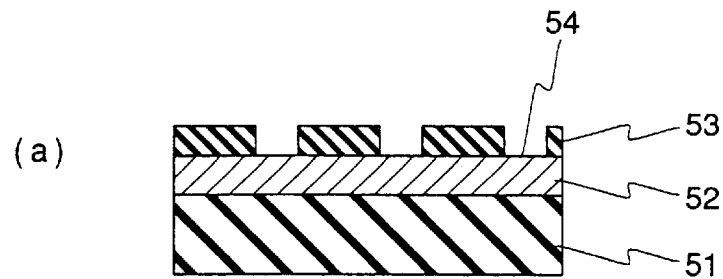
(a)
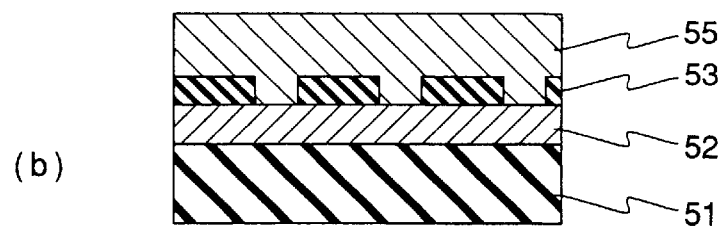
(b)
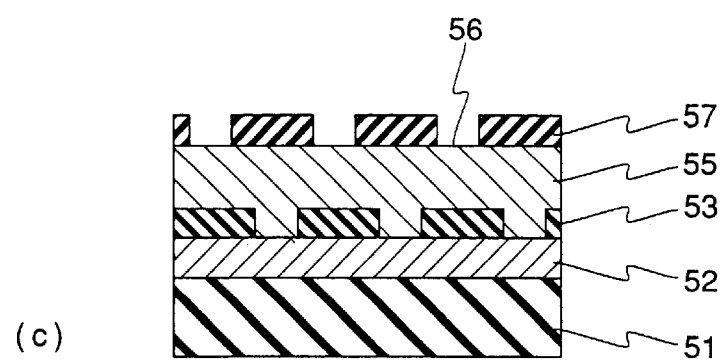
(c)
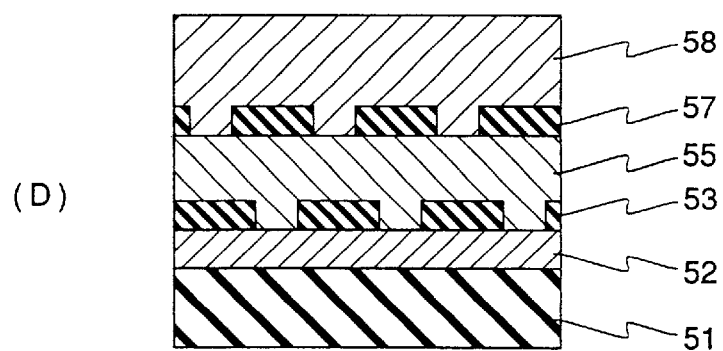
(D)

FIG. 7
(a) 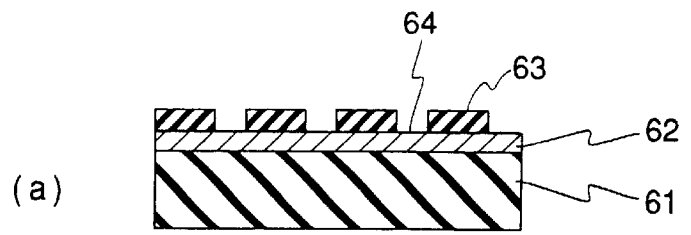
(b) 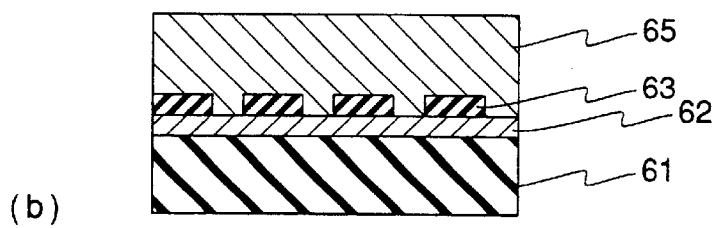
(c) 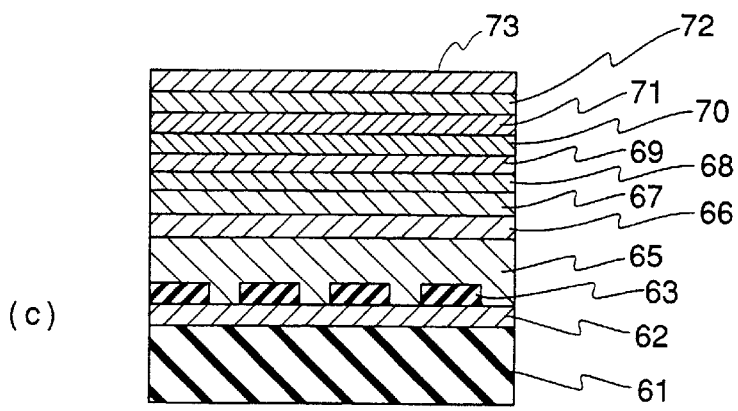
(D) 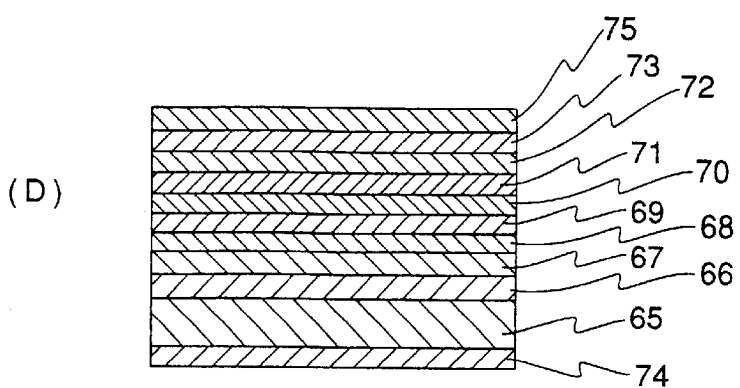

METHOD FOR MANUFACTURING GROUP III-V COMPOUND SEMICONDUCTORS

FIELD OF THE INVENTION

The present invention relates to an epitaxy method for semiconductor crystals. And more particularly to an epitaxy process for a Group III–V compound semiconductor layer on a substrate consisting of a material which has a lattice constant and thermal expansion coefficient differing from those of the Group III–V compound that constitutes the grown crystal material.

Group III–V compound semiconductors, such as gallium nitride (GaN) semiconductors, have attracted attention as materials for blue light-emitting devices due to their wide (3.4 eV) energy band gap or forbidden band gap and to the fact that they are direct-gap semiconductors.

The substrate material used in fabricating a light-emitting device with a Group III–V compound material is preferably a single crystal of the same material used for growing the epitaxial layer. With crystals such as GaN, however, the production of bulk crystal is difficult due to the high nitrogen dissociation pressure. Thus, when fabricating light-emitting devices or the like using GaN or other materials for which production of bulk crystal is difficult, the practice has been to fabricate various devices using a sapphire ($Al_2O_3$) substrate or the like. However, sapphire ($Al_2O_3$) substrates differ completely from Group III–V compounds in terms of lattice constant, thermal expansion coefficient, and other physical properties, as well as in terms of chemical properties.

When the physical properties, such as lattice constant and thermal expansion coefficient, and the chemical properties of a substrate differ completely from those of the material which is to be grown to produce the compound semiconductor layer, the following problems can arise. Fabrication of materials in which the substance used for epitaxy differs from the substance of which the substrate consists (hetero substrate) reportedly has problems in terms of epitaxial layer strain, lattice defects, and the like, particularly the occurrence of cracks when it is attempted to grow a thick crystal film (*Japanese Journal of Applied Physics*, Vol. 32, 1993, p 1528–1533). In such cases, not only is device performance severely impaired, but damage to grown crystal films due to internal stress is not uncommon.

The following has been proposed as a way of obtaining a high-quality epitaxial layer with a low dislocation density in lattice misfit epitaxy processes. Japanese Laid-Open Patent Application 8-64791 teaches the formation of an $SiO_2$ oxide film layer of stripe form approximately 1 μm wide on the sapphire substrate prior to growing the Group III–V compound. This is followed by epitaxy of a GaN film on the sapphire substrate, causing lattice defects and dislocations to become concentrated in a designated area of the substrate. In the example given in Japanese Laid-Open Patent Application 8-64791, GaN film growth does not occur in the $SiO_2$ film areas on the sapphire substrate, making it impossible to form an epitaxial layer over the entire surface of the epitaxial layer, making it difficult to produce a device.

SUMMARY OF THE INVENTION

It is an object of the present invention to provide a formation method whereby creation of strain and defects in the substrate and epitaxial layer are minimized, even during epitaxy conducted using a hetero substrate which has a different lattice constant and thermal expansion coefficient, and which affords an epitaxial layer that resists cracking even where a thick film is grown.

In order to achieve the aforementioned object, the Group III–V compound semiconductor manufacturing method employing epitaxy which pertains to the present invention comprises a step in which growing areas are produced using a mask patterned on a semiconductor substrate surface; a step in which Group III–V compound semiconductor having a lattice constant and thermal expansion coefficient different from those of the substrate is grown in the growing areas; and a step in which the Group III–V compound semiconductor is grown in the growing areas while forming facet structures, covering the mask material together with the Group III–V compound semiconductor in the adjacent growing areas, and the facet structures are then buried to planarize the surface.

The method for manufacturing a Group III–V compound semiconductor which pertains to the present invention comprises, in a Group III–V compound semiconductor layer epitaxy process, a step wherein growing areas are produced using a mask patterned on a semiconductor substrate surface; a step in which Group III–V compound semiconductor having a lattice constant and thermal expansion coefficient different from those of the substrate is grown in the growing areas; and a step in which the Group III–V compound semiconductor is grown in the growing areas while forming facet structures, covering the mask material together with the Group III–V compound semiconductor in the adjacent growing areas, and the facet structures are then buried to planarize the surface, the above steps being conducted repeatedly on the planarized surface.

The method for manufacturing a Group III–V compound semiconductor which pertains to the present invention further involves forming a Group III–V compound semiconductor film 12 consisting of the same material as the Group III–V compound semiconductor layer grown in the growing areas, or one having a similar lattice constant and thermal expansion coefficient, and then forming growing areas formed by a patterned mask material. The growing areas produced using the mask material are of a stripe, rectangular, round, or triangular configuration.

BRIEF DESCRIPTION OF THE DRAWINGS

FIGS. 1a, 1b, 1c, 1d, 1e, are process diagram illustrating a Group III–V compound semiconductor layer formation process which pertains to the present invention;

FIGS. 6a, 6b, 6c, 6d, 6c, 6d, are schematic illustrations of GaN layers produced by two iterations of the growing process of the present invention.

FIGS. 7a, 7b, 7c, 7d, are schematic illustration of laser device structure produced by growing process of the present invention.

DESCRIPTION OF THE PREFERRED EMBODIMENTS

Figure 2:
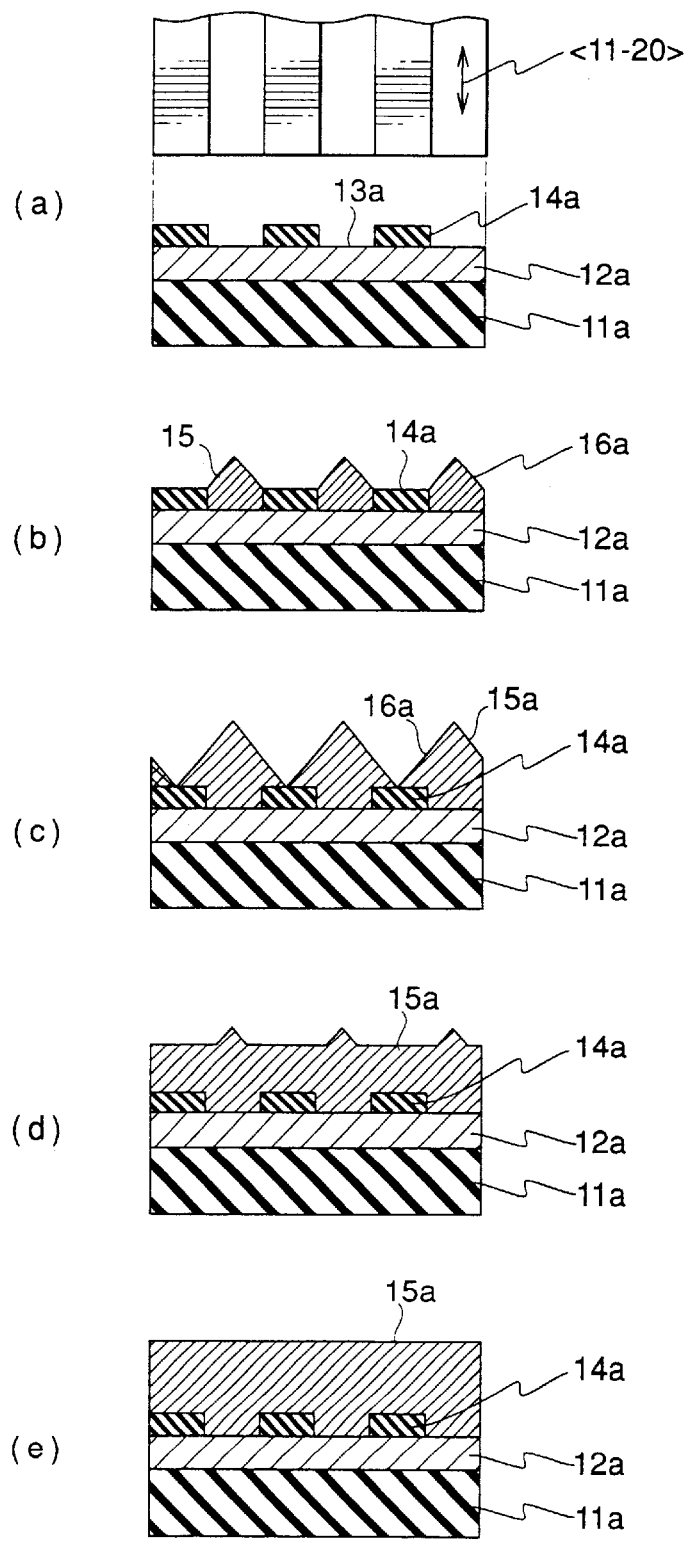
FIGS. 2a, 2b, 2c, 2d, 2e, are process diagrams illustrating another Group III–V compound semiconductor layer formation process which pertains to the present invention.

Preferred embodiments of the present invention are described below referring to the drawings.

Referring to FIG. 1, a first embodiment of the present invention will be described using the example of epitaxy of a Group III–V compound semiconductor layer.

First, a Group III–V compound semiconductor film 12 whose properties differ from those of the substrate 11 and which consists of a material identical to that used in epitaxy in the subsequent step or which exhibits a lattice constant and thermal expansion coefficient similar thereto is epitaxially grown on the substrate 11. Using a combination of photolithography and wet etching, a mask 14 is then produced on the substrate 11. The mask 14 is used to define growing areas 13 on the substrate 11. When a Group III–V compound semiconductor layer 15 is grown in the following step, no growth occurs in the areas covered by this mask 14.

The mask takes the form of stripes; the mask thickness ranges from 10 μm to about 2 μm. The growing area 13 and mask 14 widths usually range from 0.1 μm to 10 μm (see FIG. 1(a)).

Next, a Group III–V compound semiconductor film 15 is epitaxially grown over the growing areas 13. The substrate 11 with the adhering mask 14 is introduced into the reaction tube of an epitaxy apparatus (not shown). Hydrogen gas, nitrogen gas, or a mixed gas of hydrogen and nitrogen is supplied to the tube together with a Group V source gas while increasing the temperature to a level sufficient to initiate epitaxy on the substrate 11. The reaction tube temperature is then stabilized, a Group III source gas is introduced into the reaction tube, and a Group III–V compound semiconductor film 15 is grown on the growing areas 13.

Methods for growing the Group III–V compound semiconductor layer 15 (crystal) include vapor phase epitaxy (VPE) by a chloride transport process using a chloride as the Group III source material, and metalorganic vapor phase epitaxy (MOCVD) using a metalorganic compound as the Group III source material.

The group III–V compound semiconductor layer 15 is not formed over the mask 14 in the initial stage. Crystal of the Group III–V compound grow on the growing area 13 only. Facet structures 16 is formed on the surface of a Group III–V compound semiconductor layer 15 on the growing areas 13 (FIG. 1(b)). At the time, temperature range of epitaxially grown is from 650 to 1100 degree and Group V materials is introduced over ten times of quantity of Group III materials, but 200000 times or less.

While Epitaxy was continued to develop the Group III–V compound semiconductor layer, facet structures 16 touch each other (FIG. 1(c)). Growing was subsequently continued in order to bury the facet structures 16 (FIG 1(d)). Furthermore, epitaxy is continued to planarize the semiconductor surface (FIG. 1(e)).

Generally, dislocations produced by crystal formation in the growing areas 13 only extend perpendicular to the interface. Thus, dislocations can be controlled even when a thick epitaxial layer is grown.

In the growing method of this embodiment, facet structures 16 are produced in the growing areas 13 through selective growth using the mask 14. The facet structures 16 appear as a result of slower growth rate relative to other planes. The appearance of the facet structures 16 causes lines of dislocations resulting from crystal defects to move towards the facet structures 16, and as a result, lines of dislocations extending perpendicular to the substrate plane are now prevented from extending perpendicular to the substrate plane. That is, as the facet structures 16 grow, crystal defects are bent on the perpendicular with respect to the facet structures 16. As the Group III–V compound semiconductor layer 15 increases in thickness, crystal defects are reduced at the growing area 13 surfaces and either emerge from the ends of the Group III–V compound semiconductor layer 15 or form closed loops. This serves to reduce the number of crystal defects in the Group III–V compound semiconductor layer 15 produced through epitaxy.

Thus, producing facet structures 16 when growing the Group III–V compound semiconductor layer 15 offers a significant reduction in the number of lattice defects and the like present in proximity to the surface of the Group III–V compound semiconductor layer 15.

This embodiment will be described in further detail below.

The embodiment will be described referring to FIG. 1. A (0001) oriented sapphire ($Al_2O_3$) substrate 11 was used as the substrate; a GaN film 12 about 1 μm thick was initially produced on the substrate. An $SiO_2$ film for use as a mask 14 was formed over the surface of the GaN film 12, and this was patterned into mask 14 areas and growing areas 13 using photolithography and wet etching. The growing areas 13 and mask 14 areas consisted of stripes 5 μm wide and 2 μm wide, respectively. The stripes were oriented in the <11–20> direction (FIG. 1(a)). Orienting the stripes in the <11–20> plane affords a higher growth rate than do other directions.

The GaN layer subsequently grown on the growing areas 13 was produced by hydride VPE using gallium chloride (GaCl), the reaction product of gallium (G) and hydrogen chloride (HCl) as the Group III source material and ammonia (NH3) gas as the Group V source material. The substrate 11 was placed in the reaction tube of a hydride VPE apparatus (not shown) and heated to growing temperature (1000° C.) under a hydrogen atmosphere. Once the growing temperature stabilized, HCl was introduced at a flow rate of 20 cc/min, and $NH_3$ was introduced for about five minutes at a flow rate of 1000 cc/min. This procedure caused facet structures 16 comprising the GaN layer 15 {1–101} plane to grow in the growing areas 13 (FIG. 1(b)). Epitaxy was continued for about 20 minutes to develop the facet structures 16 until they covered the mask 14 (FIG. 1(c)).

The epitaxy process was continued in order to bury the facet structures 16 (FIG. 1(d)). Ultimately, a GaN layer 15 about 200 μm thick having a flat surface was produced with about five hours of growing (FIG. 1(e)). After forming the GaN layer 15, the material was cooled to normal temperature under ammonia gas and then removed from the epitaxy apparatus.

This embodiment employs a selective growing technique whereby growing areas 13 are defined by the mask 14, and accordingly facet structures 16 comprising the {1–101} plane form during crystal growth. The facet structures 16 appear due to a stower growth rate relative to other planes. Dislocations extending perpendicular to the substrate 11 prior to the appearance of the facet structures 16 are prevented from extending perpendicular to the substrate by the appearance of the facet structures 16.

Detailed examination of the crystal of the grown GaN layer produced by the epitaxy method which pertains to the present invention reveals that lines of dislocations are bent in the direction of parallel to the surface of substrate 11 by the appearance of the facet structures 16. It was found that crystal emerge from the ends of the crystal as the GaN layer 15 increases in thickness. This reduces the number of defects present within the GaN layer 15.

It was confirmed that GaN layers 15 formed in accordance with this embodiment contain no cracks despite having a lattice constant and thermal expansion coefficient different from those of the substrate 11. Furthermore, thick GaN layers 15 produced by epitaxy contain extremely low numbers of defects; the defect density is about $10^6$ cm/cm$^3$.

GaN layers 15 grown in accordance with this embodiment contain extremely low numbers of defects, and offer improved device characteristics when lasers, FETs, HBTs, and other high-quality device designs are produced thereon. It is also possible to grind away the substrate 11 in order to use the GaN layer 15 as a substrate material.

In this embodiment, a hydride VPE process was used for epitaxy of the GaN layer 15; however, similar effect can be achieved using metalorganic vapor phase epitaxy (MOCVD). While an $Al_2O_3$ substrate 11 was used, similar effect can be achieved using an Si substrate, ZnO substrate, SiC substrate, $LiGaO_2$ substrate, $MgAl_2O_4$ substrate, or the like.

In this embodiment, a GaN film 12 was pre-formed on the substrate 11, but it would be possible to form the mask 14 directly on the substrate 11.

$SiO_2$ was used as the material for the mask 14, but the invention is not limited thereto; an SiNx or other insulator film could be used. In this embodiment the mask 14 width was 2 μm, but similar effects are achieved using any width allowing the mask 14 to be buried. Here, the stripes were formed in the <11–20> direction, but provided that facet structure 16 formation is possible, the <1–100> direction lying perpendicular thereto may be used as well; additionally, directions deviating by some prescribed angle from one of these directions will allow facet structures 16 to be produced in the growing areas under proper crystal growing conditions. In particular, forming the stripes in a direction deviating by some prescribed angle from the aforementioned <11–20> direction or <1–100> direction has the advantage of improving the ultimate flatness when the GaN layer 15 is formed. The foregoing applies to the embodiments discussed below as well. Optimal conditions for crystal growth producing facet structures 16 differ by material.

In the foregoing example, epitaxy of GaN was described; however, similar effects are achieved with epitaxy of an InGaN layer, AlGaN layer, InN layer, GaP layer, or GaAs layer. Similar effects are also achieved with a Group III–V compound containing introduced impurities.

A second embodiment of the present invention will now be described. Elements shared with the first embodiment will be described referring to an analogous drawing.

This embodiment differs from the first embodiment in respect of employing a crystal prepared by initially producing an $Al_{0.1}Ga_{0.9}N$ film 12a about 1 μm thick on a (0001) oriented SiC substrate 11a. An $SiO_2$ film for use as a mask 14a was formed over the surface of the $Al_{0.1}Ga_{0.9}N$ film 12a, and this was patterned into mask 14a areas and growing areas 13a using photolithography and wet etching. The growing areas 13a and mask 14a areas consisted of stripes 2 μm wide and 10 μm wide, respectively. The stripes were oriented in the <1–100> direction (FIG. 2(a)).

The GaN layer 15a subsequently grown on the growing areas 13a was produced by hydride VPE using gallium chloride (GaCl), the reaction product of gallium (G) and hydrogen chloride (HCl) as the Group III source material and ammonia ($NH_3$) gas as the Group V source material. The substrate 11a was placed in a hydride VPE apparatus and heated to growing temperature (1000° C.) under a hydrogen atmosphere. Once the growing temperature stabilized, HCl was introduced at a flow rate of 20 cc/min, and $NH_3$ was introduced for about five minutes at a flow rate of 2000 cc/min. This procedure caused facet structures 16a comprising the GaN layer 15a{1–101} plane to grow in the growing areas 13a (FIG. 2(b)).

Epitaxy was continued for about 20 minutes to develop the GaN facet structures 16a until they covered the mask 14a (FIG. 2(c)).

The epitaxy process was continued in order to bury the facet structures 16a (FIG. 2(d)). Ultimately, a GaN layer 15a about 200 μm thick having a flat surface was produced with about five hours of growing (FIG. 2(e)). After forming the GaN layer 15a, the material was cooled to normal temperature under $NH_3$ gas and then removed from the epitaxy apparatus.

It was confirmed that GaN layers 15a formed in accordance with the second embodiment contain no cracks despite having a lattice constant and thermal expansion coefficient different from those of the substrate 11a. Furthermore, thick GaN layers 15a produced by epitaxy contain extremely low numbers of defects; the defect density is about $10^6$ cm/cm$^3$.

GaN layers 15a grown in accordance with this embodiment contain extremely low numbers of defects, and offer improved device characteristics when lasers, FETs, HBTs, and other high-quality device designs are produced thereon. It is also possible to grind away the SiC substrate 11a in order to use the GaN layer 15a as a substrate material.

In the second embodiment, a hydride VPE process was used for epitaxy of the GaN layer 15a; however, similar effect can be achieved using metalorganic vapor phase epitaxy (MOCVD). While an SiC substrate 11a was used in this embodiment, similar effect can be achieved using an Si substrate, ZnO substrate, $Al_2O_3$ substrate, $LiGaO_2$ substrate, $MgAl_2O_4$ substrate, or the like. The GaN film 12a was pre-formed on the SiC substrate 11a, but it would be possible to form the mask 14a directly on the substrate 11a.

$SiO_2$ was used as the material for the mask 14a, but the invention is not limited thereto; an SiNx or other insulator film could be used. In this embodiment, the mask 14a width was 10 μm, but similar effects are achieved using any width allowing the mask 14a to be buried. Here, the stripes were formed in the <1–100> direction, but provided that facet structure 16a formation is possible, the <1–120> direction lying perpendicular thereto may be used as well; additionally, directions deviating by some prescribed angle from one of these directions will allow facet structures 16a to be produced in the growing areas under proper crystal growing conditions. Optimal conditions for crystal growth producing facet structures 16a differ by material.

In this embodiment, AlGaN of 0.1 Al composition was used for the film pre-formed on the substrate 11a, but the composition may be selected arbitrarily; similar effects are obtained using AlN, InGaN, or the like for the film. Epitaxy of a GaN layer 15a was described; however, similar effects are achieved with epitaxy of an InGaN layer, AlGaN layer, InN layer, GaP layer, or GaAs layer. Similar effects are also achieved with a Group III–V compound containing introduced impurities.

Figure 3:
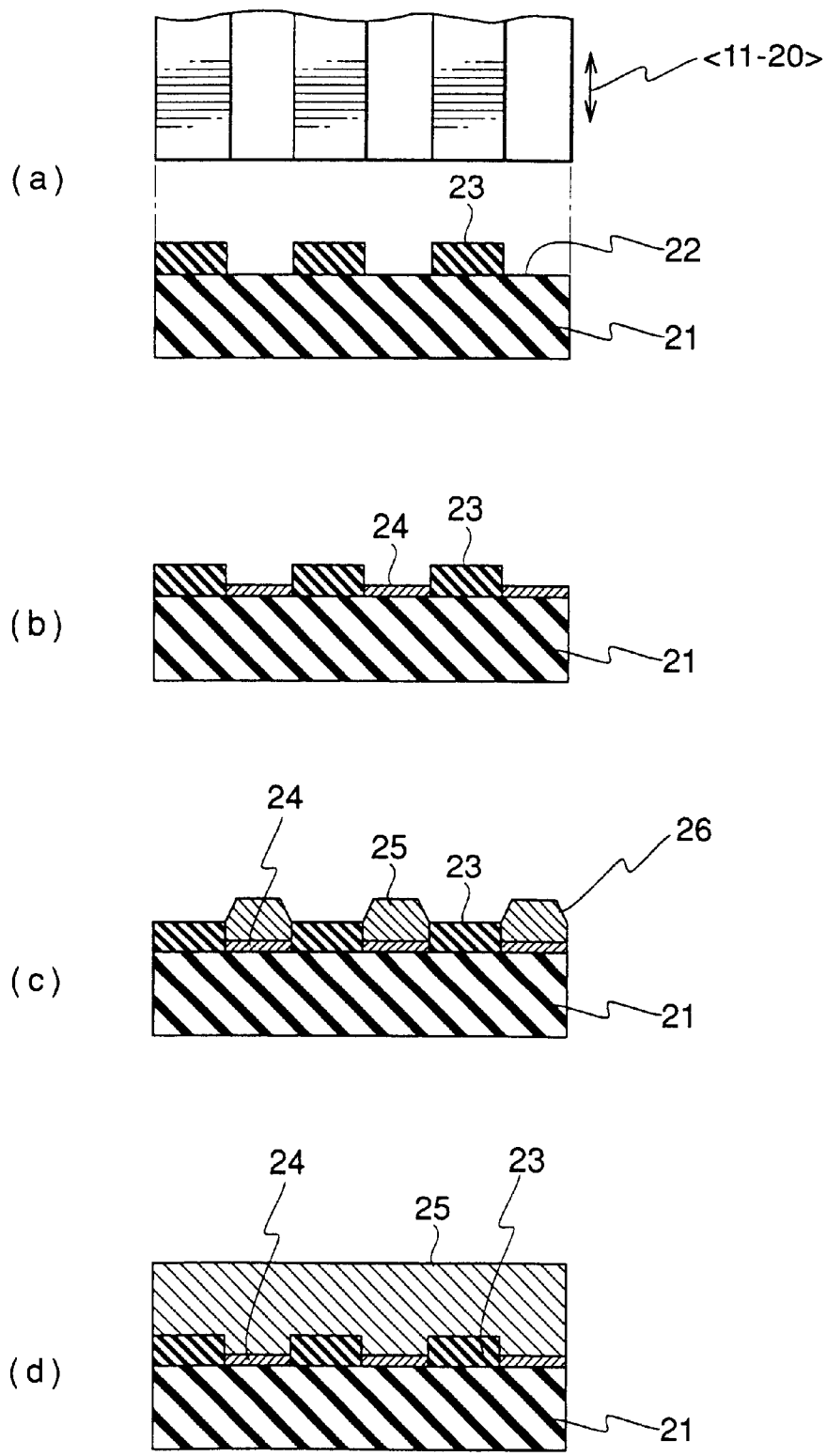
FIGS. 3a, 3b, 3c, 3d, are process diagrams illustrating formation by means of a hydride VPE process of a GaN layer on an $MgAl_2O_4$ substrate provided with a an AlGaNa film.

A third embodiment of the present invention will now be described referring to FIG. 3.

In this third embodiment, a (111) oriented $MgAl_2O_4$ substrate 21 was used as the substrate. An $SiO_2$ film 23 was formed over the surface of the substrate 21, and this was patterned into mask 23 areas and growing areas 22 using photolithography and wet etching. The growing areas 22 and mask 23 areas consisted of stripes 4 μm wide and 3 μm wide, respectively. The stripes were oriented in the <1–120> direction (FIG. 3(a)).

Hydride VPE was employed for GaN layer 25 formation to prevent polycrystalline GaN from being deposited on the mask 23. In this process, gallium chloride (GaCl), the reaction product of gallium (G) and hydrogen chloride (HCl), was used as the Group III source material and ammonia ($NH_3$) gas as the Group V source material.

First, the substrate 21 was placed in an epitaxy apparatus and heat treated at high temperature (1000° C.) under a hydrogen gas flow. The temperature was then lowered to 500° C. HCl was introduced at a flow rate of 0.5 cc/min and $NH_3$ was introduced for about five minutes at a flow rate of 1000 cc/min to produce a GaN buffer layer 24 approximately 20 nm thick over the growing areas 23 (FIG. 3(b)).

In this state, the temperature was raised to 1000° C. while introducing $NH_3$ gas. Once growing temperature had stabilized, HCl was introduced at a flow rate of 20 cc/min, and $NH_3$ was introduced for about five minutes at a flow rate of 1500 cc/min. This procedure caused facet structures 26 comprising the GaN {1–101} plane to grow over the GaN buffer layer 24 in the growing areas 22 (FIG. 3(c)).

Epitaxy was continued to develop the GaN layer 25 facet structures 26 until they covered the mask 23. Growing was subsequently continued in order to bury the facet structures 26. Ultimately, a GaN layer 25 about 200 μm thick having a flat surface was produced with about five hours of growing (FIG. 3(d)). After forming the GaN layer 25, the material was cooled to normal temperature under $NH_3$ gas and then removed from the epitaxy apparatus.

It was confirmed that GaN layers 25 formed in accordance with the third embodiment contain no cracks despite having a lattice constant and thermal expansion coefficient different from those of the $MgAl_2O_4$ substrate 21. Furthermore, thick GaN layers 25 produced by epitaxy contain extremely low numbers of defects, on the order of $10^6$ cm/cm$^3$.

GaN layers 25 grown in accordance with this embodiment contain extremely low numbers of defects, and offer improved device characteristics when lasers, FETs, HBTs, and other high-quality device designs are produced thereon. It is also possible to grind away the $MgAl_2O_4$ substrate 21 in order to use the GaN layer 25 as a substrate material.

In the third embodiment, a hydride VPE process was used for epitaxy of the GaN layer 25; however, similar effect can be achieved using metalorganic vapor phase epitaxy (MOCVD). While an $MgAl_2O_4$ substrate 21 was used in this embodiment, similar effect can be achieved using an Si substrate, ZnO substrate, SiC substrate, $LiGaO_2$ substrate, $Al_2O_3$ substrate, or the like. The mask 23 was formed directly on the $MgAl_2O_4$ 21, but it would be possible to form the GaN buffer layer 24 on the substrate 21 in advance.

$SiO_2$ was used as the material for the mask 24, but the invention is not limited thereto; an SiNx or other insulator film could be used. In this embodiment, the mask 24 width was 10 μ, but similar effects are achieved using any width allowing the mask 24 to be buried. In this embodiment, the stripes were formed in the <11–20> direction, but provided that facet structure 26 formation is possible, the <1–100> direction lying perpendicular thereto may be used as well; additionally, directions deviating by some prescribed angle from one of these directions will allow facet structures 26 to be produced in the growing areas under proper crystal growing conditions. Optimal conditions for crystal growth producing facet structures 26 differ by material.

In this embodiment, formation of the GaN layer 25 was conducted after producing the GaN buffer layer 24 on the substrate 21; this afforded further reductions in crystal defects.

Epitaxy of a GaN layer 25 was described; however, similar effects are achieved with epitaxy of an InGaN layer, AlGaN layer, InN layer, GaP layer, or GaAs layer. Similar effects are also achieved with a Group III–V compound containing introduced impurities.

Figure 4:
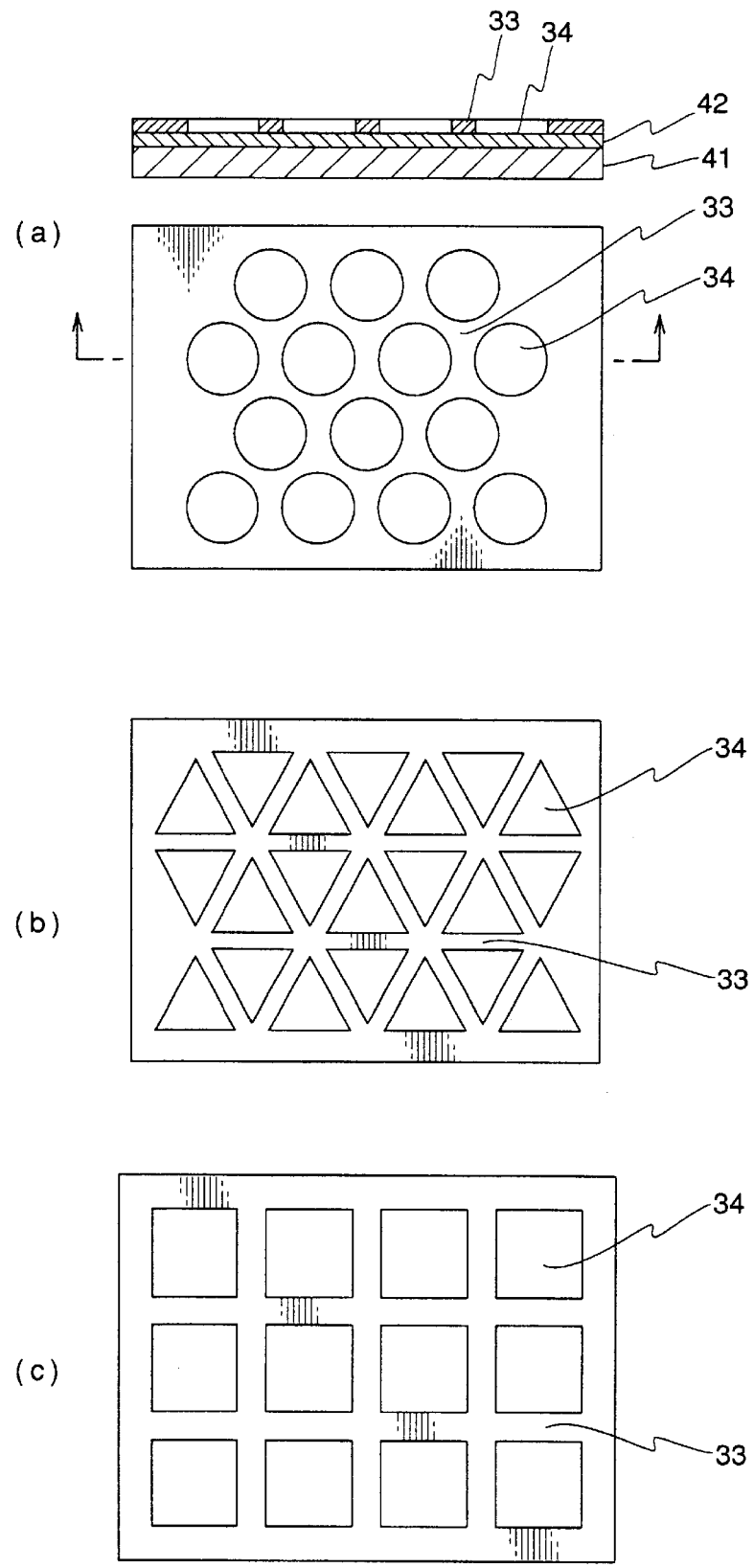
FIGS. 4a, 4b, 4c, are give schematic illustrations of selective epitaxy growing areas of round, triangular, and rectangular shape.

A fourth embodiment of the present invention will now be described referring to FIGS. 4 and 5. FIG. 4 gives schematic illustrations of round, triangular, and rectangular shapes for the growing areas 34 for conducting selective epitaxy.

In this fourth embodiment, a (0001) oriented $Al_2O_3$ substrate 41 provided with a GaN film 42 approximately 1 μm thick was used as the crystal substrate.

An $SiO_2$ film was formed over the surface of the GaN film 42, and this was patterned into mask 33 areas and growing areas 34 using photolithography and wet etching. Three types of masks, in which the growing areas 34 were circles 4 μm in diameter (FIG. 4(a)), triangles 3 μm per side (FIG. 4(b)), and rectangles 5 μm per side (FIG. 4(c)), were produced.

To produce a GaN layer 45 in the growing areas 34, trimethylgallium (TMGa) and trimethylaluminum (TMAl) were used as Group III source materials and ammonia ($NH_3$) gas was used as the Group V source material in a metalorganic vapor phase epitaxy process.

Figure 5:
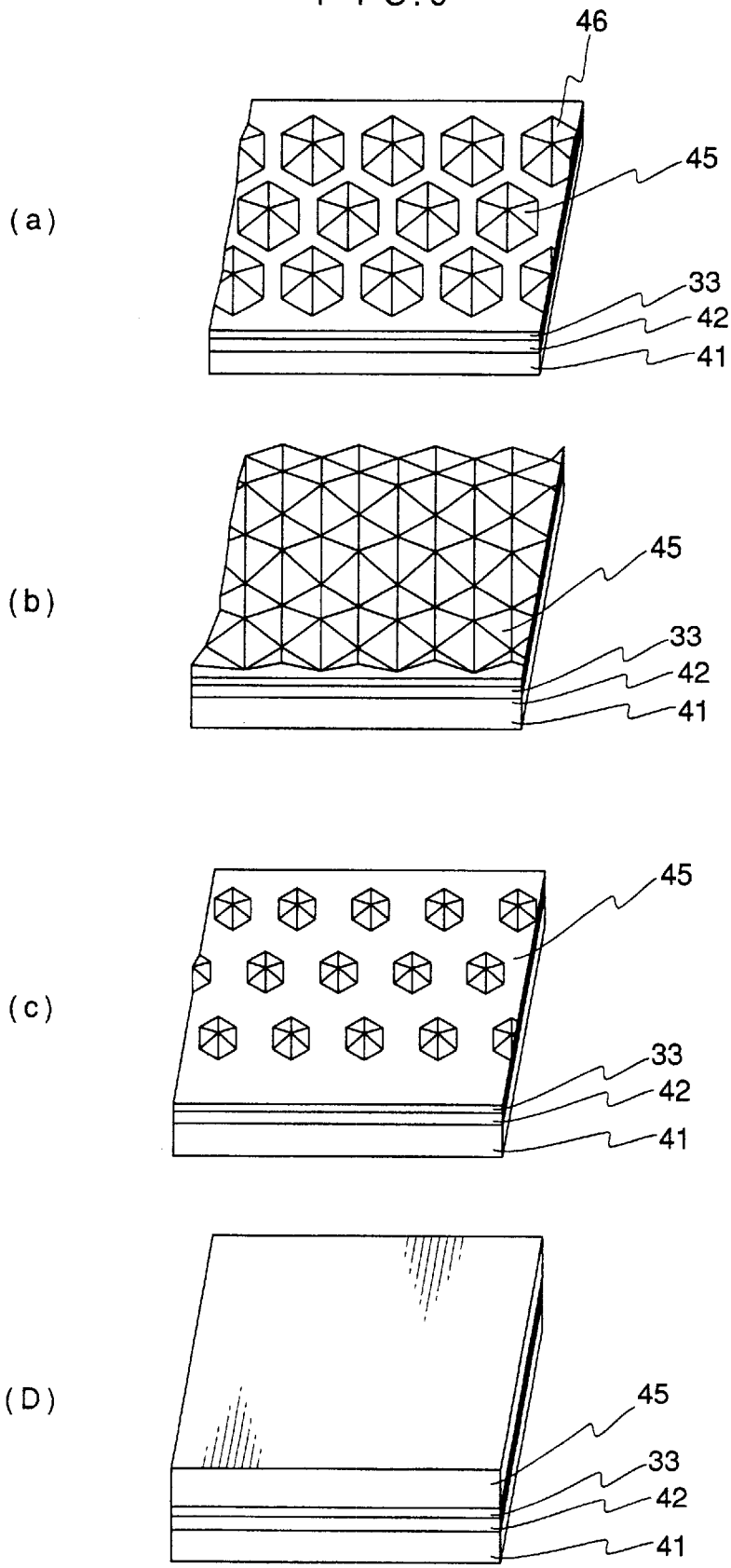
FIGS. 5a, 5b, 5c, 5d, are process diagram illustrating formation by vapor phase deposition of a Group III–V compound semiconductor layer on a substrate provided with the round, triangular, and rectangular growing areas depicted in FIG. 4.

FIG. 5 is a schematic illustration of the process for producing by vapor phase epitaxy the GaN layer 45 (Group III–V compound semiconductor layer) on the substrate 41 provided with growing areas 34. The substrate 41 was placed in a metalorganic vapor phase epitaxy apparatus and heated to growing temperature (1050° C.) while introducing hydrogen gas and $NH_3$ gas. Once the growing temperature stabilized, trimethylgallium was introduced at a flow rate of 5 cc/min, and $NH_3$ was introduced for about 10 minutes at a flow rate of 5000 cc/min. This procedure caused facet structures 46 comprising the GaN layer 45 {1–101} plane to grow in the growing areas 34 (FIG. 5(a)).

Epitaxy was continued for about 30 minutes to develop the GaN layer 45 facet structures 46 until they covered the mask 33 (FIG. 5(b)).

Epitaxy was subsequently continued in order to bury the facet structures 46 of the GaN layer 45 (FIG. 5(c)). Ultimately, a GaN layer 45 about 100 μm thick having a flat surface was produced with 12 hours of growing (FIG. 5(d)).

It was confirmed that GaN layers 45 produced in growing areas of all three shapes (round, triangular, and rectangular) had flat surfaces regardless of the shape of the growing areas 34, and that the substrate 41 contained no cracks. In this embodiment, three shapes, round, triangular, and rectangular, were used for the growing areas 34; however, provided it was possible to bury the mask 33 regardless of polygon shape or size.

GaN layers 45 grown in accordance with this embodiment contain extremely low numbers of defects, and offer improved device characteristics when lasers, FETs, HBTs, and other high-quality device designs are produced thereon. It is also possible to grind sapphire substrate 41 in order to use the GaN layer 45 as a substrate material.

In the fourth embodiment, a hydride VPE process was used for epitaxy of the GaN layer 45; however, similar effect can be achieved using metalorganic vapor phase epitaxy (MOCVD). While an $Al_2O_3$ substrate 41 was used in this embodiment, similar effect can be achieved using an Si substrate, ZnO substrate, SiC substrate, $LiGaO_2$ substrate, $MgAl_2O_4$ substrate, or the like. The mask 33 was formed directly on the $Al_2O_3$ substrate 41, but it would be possible to form the GaN buffer layer 42 on the substrate 41 in advance.

$SiO_2$ was used as the material for the masks 33, but the invention is not limited thereto; an SiNx or other insulator film could be used.

Similar effects may be achieved with epitaxy of InGaN layer, AlGaN layer, InN layer, GaP layer, or GaAs layer. Similar effects are also achieved with a Group III–V compound containing introduced impurities.

A fifth embodiment of the present invention will now be described referring to FIG. 6.

The fabrication process steps in FIGS. 6(a) and (b) are analogous to those in the first embodiment depicted in FIGS. 1(a) through (e); accordingly, description thereof would be redundant. In this embodiment, a the Group III–V compound semiconductor layer 55 is epitaxially grown and the surface thereof is planarized. A second mask 57 is produced (FIG. 6(c)), and facet structures (not shown) are produced analogously with the first embodiment. Epitaxy is continued and the surface is planarized (FIG. 6(d)). Thus, in this embodiment, the masks 53 and 57 and the GaN layers 55 and 58 each have a dual layer structure.

In the fifth embodiment, the fabrication steps depicted in FIGS. 1(a) through (e) are conducted in two iterations to further reduce the defect density in the Group III–V compound semiconductor layers.

This embodiment may be employed effectively where crystals are grown from materials having lattice constants and coefficients of thermal expansion that are different from those of the substrate 51, and may be employed for growing GaN, GaAlN, InGaN, InN, GaAs, GaP, and other the Group III–V compound semiconductors on substrates of $Al_2O_3$, Si, SiC, $MgAl_2O_4$, $LiGaO_2$ substrate, ZnO, and the like.

In the example depicted in FIG. 6, a Group III–V compound semiconductor film 52 consisting of the same material as that grown in the subsequent step, or one having a lattice constant and thermal expansion coefficient similar to that of the material, is produced on the substrate 51, and a mask 53 is then formed on the surface thereof; however, similar effects may be achieved by directly forming the mask 53 on the substrate 51 and conducting the processes illustrated in FIGS. 6(b) through (d).

In this embodiment, a mask patterned into stripes was used as the mask 53. However, the present invention is not limited thereto; a mask 53 with growing areas 54 and 56 of rectangular, round, or triangular shape may be employed, as long as facet structures are produced.

This embodiment will be described in further detail. A (0001) oriented sapphire substrate 51 provided with a GaN film 52 1 $\mu$m thick was used as the substrate 51.

An $SiO_2$ film was formed over the surface of the substrate 51, and this was patterned into first mask 53 areas and first growing areas 54 using photolithography and wet etching. The first growing areas 54a and first mask 53 areas consisted of stripes 2 $\mu$m wide and 5 $\mu$m wide, respectively. The stripes were oriented in the <11–20> direction (FIG. 6(a)).

To form the first GaN layer 55 on the first growing areas 54, a hydride VPE process using gallium chloride (GaCl), the reaction product of gallium (Ga) and hydrogen chloride (HCl), as the Group III source material and ammonia ($NH_3$) gas as the Group V source material was conducted analogously to the first embodiment. The substrate 51 was placed in a hydride VPE apparatus and heated to growing temperature (1000° C.) under a hydrogen atmosphere. Once the growing temperature stabilized, HCl was introduced at a flow rate of 10 cc/min, $NH_3$ was introduced at a flow rate of 4000 cc/min, and epitaxy was conducted over a 60 minute period. Following the epitaxy process described in the first embodiment and depicted in FIGS. 1(a) through (e), a first GaN layer 55 in which the first mask 53 was buried was produced (FIG. 6(b)). After forming the first GaN layer 55, the material was cooled to normal temperature in an $NH_3$ gas atmosphere and then removed from the epitaxy apparatus.

Next, an $SiO_2$ film was again formed on the GaN layer 55, and second growing areas 56 and second mask 57 areas were produced. The stripe widths thereof were 2 $\mu$m and 5 $\mu$m, respectively. The stripes were oriented in the <11–20> direction (FIG. 6(c)). Again following the epitaxy process described in the first embodiment and depicted in FIGS. 1(a) through (e), a second GaN layer 58 approximately 150 $\mu$m thick and containing the buried second mask 57 was produced, and a planarized surface was obtained (FIG. 6(d)).

The second GaN layer 58 so produced was examined for defects using a profile transmission electron microscope; defects were found to be extremely few ($10^5$ cm/cm$^3$ or less). Here, a two-stage selective epitaxy process was described, but it would be possible to further reduce defect density (dislocation density) by repeating the processes described above.

In the fifth embodiment, a hydride VPE process was used for epitaxy of the GaN layers 55 and 58; however, similar effect can be achieved using metalorganic vapor phase epitaxy (MOCVD). While an $Al_2O_3$ substrate 51 was used, similar effect can be achieved using an Si substrate, ZnO substrate, SiC substrate, $LiGaO_2$ substrate, $MgAl_2O_4$ substrate, or the like. The mask 53 was produced after forming a GaN film 52 on the $Al_2O_3$ substrate 51, but the invention is not limited thereto; it would be possible to produce the first mask 53 directly on the substrate 51 without forming a GaN film 52 on the substrate 51.

$SiO_2$ was used as the material for the masks 53 and 57, but the invention is not limited thereto; an SiNx or other insulator film could be used. In this embodiment, the masks 53 and 55 were patterned so as to produce growing areas 54 and 56 of stripe form, but the shape is not limited thereto and may alternatively be round, rectangular, or triangular. Epitaxy of GaN was described; however, similar effects are achieved with epitaxy of an InGaN layer, AlGaN layer, InN layer, GaP layer, or GaAs layer. Similar effects are also achieved with a Group III–V compound containing introduced impurities.

The embodiments described above are examples of the use of GaN the Group III–V compound semiconductors; however, but the invention is not limited thereto and may be adapted for epitaxy of Group III–V compound semiconductors exhibiting a lattice constants or thermal expansion coefficients different from those of the substrate.

As described in the foregoing, the Group III–V compound semiconductor epitaxy method which pertains to the present invention makes it possible to produce a high quality the Group III–V compound semiconductor layer by limiting the growing area on the substrate through the use of a mask during initial growing to promote formation of facets, thereby reducing the incidence of cracking and reducing the introduction of defects due to a lattice constant differential and thermal expansion coefficient differential between a Group III–V compound semiconductor layer and a substrate crystal. Accordingly, the crystal growing method which pertains to the present invention can be used to form high quality laser designs and transistor designs, and dramatically improves the characteristics thereof.

A sixth embodiment of the present invention will now be described referring to FIG. 7. FIG. 7 gives schematic illustrations of explanation of epitaxial grown method applying for producing GaN thick layer, further explanation of process manufacturing method of GaN material semiconductor laser.

In FIG. 7, sapphire substrate 61 of (0001) plane direction is used for the substrate 61, and GaN film 62 of 1 $\mu$m thick is produced on a surface of the sapphire substrate 61. $SiO_2$ film is produced on the surface of substrate 61, surface of substrate is separated to first mask area 63 and first growing areas 64 using photolithography and wet etching same to first embodiment. First mask area 63 and first growing areas 64 is produced with shape of stripe. Width of first mask area is 5 $\mu$m and width of first growing areas is 2 $\mu$m. Direction of stripe is lay 10 degree from <11–20> direction (FIG. 5($a$)).

First GaN layer 65 which grow on the growing areas 64 is produced using hydride VPE method. This method use GaCl reacted from Ga and HCl as Group III material, and NH3 gas is used as Group V material. The substrate 61 is set in hydride VPE apparatus, temperature of the hydride VPE apparatus is set about 1000 degree with hydrogen gas atmosphere. Next, substrate 61 is set in $NH_3$ gas atmosphere on 650 degree. After temperature is stable, HCl is supplied with 40 cc/min, $NH_3$ is supplied with 1000 cc/min, $SiH_4$ is supplied with 0.01 cc/min. After 150 minutes of growing time, First GaN layer 65 is produced with 200 $\mu$m thick covering the first mask areas 63 (FIG. 5($b$)). This process is already explained in first embodiment, especially from FIG. 1($a$) to FIG. 1($e$). After producing first GaN layer 65, substrate is cooled with $NH_3$ gas atmosphere, and substrate is removed from hydride VPE apparatus. Carrier density of GaN layer 65 is over $1 \times 10^{18}$ cm$^{-3}$, and the GaN layer 65 is n-type.

Next, Organometallic VPE (MOVPE) method is used for manufacturing nitride material Group III–V semiconductor laser device. After producing GaN layer 65, the substrate 61 is set in MOVPE apparatus, temperature of MOVPE apparatus is set to 1050 degree with hydrogen gas atmosphere. After that, temperature of MOVPE apparatus is reduced to 650 degree and change to $NH_3$ gas atmosphere. On the substrate 61, following layer is produced. A n-type GaN layer 66 of 1 $\mu$m thick with Si doped, a n-type $Al_{0.15}Ga_{0.85}N$ clad layer 67 of 0.4 $\mu$m thick with Si doped, a n-type GaN light guide layer .68 of 0.1 $\mu$m thick with Si doped, a 10 cycle multiple quantum well structural active layer 69 made with a $In_{0.2}Ga_{0.8}N$ quantum well layer of 2.5 nm thick with undoped and a $In_{0.05}Ga_{0.95}N$ barrier layer of 5 nm thick with undoped, a p-type $Al_{0.2}Ga_{0.8}N$ layer 70 of 20 nm thick with Mg doped, a p-type GaN light guide layer 71 of 0.1 $\mu$m thick with Mg doped, a p-type $Al_{0.51}Ga_{0.85}N$ clad layer 72 of 0.4 $\mu$m thick with Mg doped, a p-type GaN contact layer 73 of 0.5 $\mu$m thick with Mg doped. Laser device is produced with these layers. After producing p-type GaN contact layer 73, temperature of MOVPE apparatus reduced to normal temperature, and substrate 61 is removed from MOVPE apparatus (FIG. 7($c$)). The multiple quantum well structural active layer 69 is produced with 780 degree of temperature.

Next, sapphire substrate 61 having laser device structure is set on a grinding machine. Sapphire substrate 61, GaN layer 62, the mask made with Si is excluded by grinding. And these layer are excluded. And also, GaN thick layer 65 is excluded about 50 $\mu$m thick. GaN thick layer 65 is exposed. On the exposed surface, n-type electrode 74(made with titanium and aluminum) is produced, and p-type electrode 75 (made with Ni and Au) is produced on p-type GaN layer 73 (FIG. 7($d$)).

The laser device structure on FIG. 7, n-type electrode is produced on back surface of epitaxial layer, so it is not necessary to use dry etching method to produce n-type electrode on nitride material layer. This invention can simplify manufacturing method of electrode.

And the cleaveage plane of sapphire is different from GaN material semiconductor, so it was difficult to make a resonator mirror on sapphire substrate with cleavage.

Meanwhile, in this invention, it is possible to make GaN thick layer 65 without crystal defect. So there is no bad influence for the laser device structure of GaN material semiconductor even though exclude (grind) the sapphire substrate and the mask. And a resonator mirror plane is produced by cleavage of laser device structure on the GaN layer 65, so manufacturing method was simplified compare with former method using dry etching.

In this embodiment, sapphire substrate 61, GaN layer 62 and $SiO_2$ mask 63 is excluded after the laser device structure was produced on the GaN layer 65. But it is same to grind sapphire substrate 61, GaN layer 62 and $SiO_2$ mask before producing laser device structure.

And, in this embodiment, sapphire-substrate 61, GaN layer 62 and $SiO_2$ mask 63 was excluded. And some part of GaN layer 65 was excluded. After that n-type electrode was produced. But without grinding, exclude n-type GaN layer 66 or 65 with dry etching method, and produce n-type electrode, and it is possible to make former laser device structure with producing the resonator mirror plane.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 9-059076 (Filed on Mar. 13th, 1997) including specification, claims, drawings and summary are incorporated herein by reference in its entirety.

What is claimed is:

1. A Group III–V compound semiconductor manufacturing method employing epitaxy, comprising the steps of:
    (a) producing growing areas on a substrate surface using a mask;
    (b) conducting epitaxy of a Group III–V compound semiconductor on the growing areas while forming facet structures; and
    (c) continuing epitaxy to planarize the semiconductor surface wherein lines of dislocations resulting from crystal defects are bent on the perpendicular with respect to said facet structures so that lines of dislocation extending perpendicular to the substrate plane are prevented.

2. A semiconductor manufacturing method as defined in claim 1, wherein
    (a) producing a semiconductor film consisting of the same material as the semiconductor layer on the substrate surface; and (b) producing the growing areas on the surface of the semiconductor film using the mask.

3. A semiconductor manufacturing method as defined in claim 2, wherein the semiconductor layer consists of a GaN material.

4. A semiconductor manufacturing method as defined in claim 2, wherein the semiconductor film consists of at least two materials selected from GaN, InGaN, and AlGaN.

5. A semiconductor manufacturing method as defined in claim 1, wherein
   (a) producing a semiconductor film on the substrate surface;
      the semiconductor film having a lattice constant and thermal expansion coefficient similar to that of the material of the semiconductor layer; and
   (b) producing the growing areas on the surface of the semiconductor film using the mask.

6. A semiconductor manufacturing method as defined in claim 5, wherein the semiconductor layer consists of a GaN material.

7. A semiconductor manufacturing method as defined in claim 5, wherein the semiconductor film consists of at least two materials selected from GaN, InGaN, and AlGaN.

8. A semiconductor manufacturing method as defined in claim 1, wherein the shape of the growing areas produced by the mask is a stripe.

9. A semiconductor manufacturing method as defined in claim 8, wherein the growing areas of stripe form are oriented in the <11–20> direction or <1–100> direction.

10. A semiconductor manufacturing method as defined in claim 1, wherein the facet structure surfaces lie in the {1–101} plane direction.

11. A semiconductor manufacturing method as defined in claim 1, wherein the growing areas produced by the mask have a round shape.

12. A semiconductor manufacturing method as defined in claim 1, wherein the growing areas produced by the mask have a triangular shape.

13. A semiconductor manufacturing method as defined in claim 1, wherein
   (a) the substrate is an $MgAl_2O_4$ substrate, Si substrate, ZnO substrate, SiC substrate, $LiGaO_2$ substrate, or $Al_2O_3$ substrate; and
   (b) the semiconductor layer is a GaN layer, InGaN layer, AlGaN layer, InN layer, GaP layer, or GaAs layer.

14. A Group III–V compound semiconductor manufacturing method employing epitaxy, comprising the steps of:
   (a) producing first growing areas on a substrate surface using a mask;
   (b) conducting epitaxy of a first semiconductor layer of a Group III–V compound on the first growing areas while forming facet structures;
   (c) continuing epitaxy to planarize the surface of the first semiconductor layer;
   (d) producing second growing areas on the surface of the first semiconductor layer using a mask;
   (e) conducting epitaxy of a second semiconductor layer on the second growing areas while forming facet structures; and
   (f) continuing epitaxy to planarize the surface of the second semiconductor layer.

15. A semiconductor manufacturing method as defined in claim 14, wherein
   (a) the substrate surface is provided with a semiconductor film consisting of the same material as the semiconductor layer; and
   (b) the surface of the semiconductor film is provided with the growing areas by means of the mask.

16. A semiconductor manufacturing method as defined in claim 14, wherein
   (a) producing a semiconductor film on the surface of the substrate;
      semiconductor film material having a lattice constant and thermal expansion coefficient similar to that of the material of the semiconductor layer; and
   (b) producing the growing areas on the surface of the semiconductor film using the mask.

17. A semiconductor manufacturing method as defined in claim 16, wherein the semiconductor layer consists of a GaN material.

18. A semiconductor manufacturing method as defined in claim 16, wherein the semiconductor film consists of at least two materials selected from GaN, InGaN, and AlGaN.

19. A semiconductor manufacturing method as defined in claim 14, wherein the shape of the growing areas produced by the mask is a stripe.

20. A semiconductor manufacturing method as defined in claim 19, wherein the growing areas of stripe form are oriented in the <11–20> direction or <1–100> direction.

21. A semiconductor manufacturing method as defined in claim 14, wherein the facet structure surfaces lie in the {1–101} plane direction.

22. A semiconductor manufacturing method as defined in claim 14, wherein the growing areas produced by the mask have a round shape.

23. A semiconductor manufacturing method as defined in claim 14, wherein the growing areas produced by the mask have a triangular shape.

24. A semiconductor manufacturing method as defined in claim 14, wherein
   (a) the substrate is an $MgAl_2O_4$ substrate, Si substrate, ZnO substrate, SiC substrate, $LiGaO_2$ substrate, or $Al_2O_3$ substrate; and
   (b) the semiconductor layer is a GaN layer, InGaN layer, AlGaN layer, InN layer, GaP layer, or GaAs layer.

25. A method of manufacturing light emitting device, comprising the steps of:
   (a) producing growing areas on a substrate surface using the mask;
      the substrate having a different lattice constant and thermal expansion coefficient from a GaN material semiconductor,
   (b) conducting epitaxy of a GaN material semiconductor layer on the growing areas while forming facet structures, and covering the mask with the GaN material semiconductor layer;
   (c) continuing epitaxy to planarize a surface of the GaN material thick semiconductor layer;
   (d) producing GaN material semiconductor layer containing double hetero structures on the GaN material thick semiconductor layer.

26. A method of manufacturing light emitting device, comprising the steps of:
   (a) producing growing areas on a substrate surface using the mask;
      the substrate having a different lattice constant and thermal expansion coefficient from GaN material semiconductor,
   (b) conducting epitaxy of the GaN material semiconductor layer on the growing areas while forming facet structures, and covering the mask with the GaN material semiconductor layer;

(c) continuing epitaxy to planarize the surface of the GaN material thick semiconductor layer;

(d) producing GaN material semiconductor layer containing double hetero structures on the GaN material thick semiconductor layer;

(e) excluding the substrate and the mask from the GaN material thick semiconductor layer.

27. A method of manufacturing light emitting device, comprising the steps of:

(a) producing growing areas on a substrate surface using the mask;

the substrate having a different lattice constant and thermal expansion coefficient from GaN material semiconductor, (b) conducting epitaxy of a GaN material semiconductor layer on the growing areas while forming facet structures, and covering the mask with the GaN material semiconductor layer;

(c) continuing epitaxy to planarize a surface of the GaN material thick semiconductor layer, (d) producing GaN material semiconductor layer containing double hetero structures on the GaN material thick semiconductor layer, (e) excluding the substrate and the mask from the GaN material thick semiconductor layer;

(f) producing an electrode on the bottom surface of GaN material thick semiconductor layer which after getting rid of the substrate and the mask.

* * * * *